United States Patent [19]

Perrin et al.

[11] Patent Number: 5,818,173
[45] Date of Patent: Oct. 6, 1998

[54] CYLINDRICAL ANTENNA HAVING MEANS FOR GENERATING A MAGNETIC FIELD IN A VICINITY OF THE ANTENNA

[75] Inventors: Aimé Perrin, St Ismier; Bernard Rolland, Neylan, both of France

[73] Assignees: Commissariat a l'Energie Atomique, Paris; Etat Francais represente par le Delegue General pour l'Armement, Armees, both of France

[21] Appl. No.: 812,670

[22] Filed: Mar. 10, 1997

Related U.S. Application Data

[63] Continuation of Ser. No. 516,359, Aug. 17, 1995, abandoned.

[30] Foreign Application Priority Data

Sep. 6, 1994 [FR] France ................................. 94 10646
Jun. 26, 1995 [WO] WIPO ..................... PCT/FR95/00849

[51] Int. Cl.⁶ .................................................. H04B 5/00
[52] U.S. Cl. .............................. 315/111.21; 315/111.41; 343/787; 343/788
[58] Field of Search ................................. 343/787, 788; 315/111.11, 111.21, 111.31, 111.41, 111.71, 111.81, 111.51

[56] References Cited

U.S. PATENT DOCUMENTS 977,462  12/1910  Matthews ............................. 343/788
2,863,143 12/1958 Berlin ...................................... 343/787
2,863,147 12/1958 Berlin ...................................... 343/787
2,975,421  3/1961 Chichester .............................. 343/787
3,238,531  3/1966 Kaufman et al. .
4,148,036  4/1979 Miller ....................................... 343/788
4,857,161  8/1989 Borel et al. ........................ 204/192.26
5,397,962  3/1995 Moslehi ............................. 315/111.51

FOREIGN PATENT DOCUMENTS 0 448 077  9/1991  European Pat. Off. .
0 613 329  8/1994  European Pat. Off. .
  592763   9/1947  United Kingdom .

OTHER PUBLICATIONS

Maeno Shuichi, Patent Abstracts of Japan, vol. 18, No. 116 (E–1515), Feb. 24, 1994, JP–A–5–314918, Nov. 26, 1993.

*Primary Examiner*—Robert J. Pascal
*Assistant Examiner*—David H. Vu
*Attorney, Agent, or Firm*—Oblon, Spivak, McClelland, Maier & Neustadt, P.C.

[57] ABSTRACT

The invention relates to a microwave antenna having at least one tubular portion with a central axis, and magnets which are located within the tubular portion along the central axis. The magnets generate a magnetic field in the vicinity of the antenna, with each end of each magnet facing an end having the same polarity of an immediately adjacent magnet. This type of antenna is used in the manufacture of microtips on large surfaces.

13 Claims, 10 Drawing Sheets

CYLINDRICAL ANTENNA HAVING MEANS FOR GENERATING A MAGNETIC FIELD IN A VICINITY OF THE ANTENNA

This application is a Continuation of application Ser. No. 08/516,359, filed on Aug. 17, 1995, now abandoned.

DESCRIPTION

1. Technical Field

The present invention relates to the general technical field of generating a plasma in a gaseous medium on the basis of a microwave excitation, more particularly by cyclotron electron resonance (ECR).

In order to have this resonance, the magnetic field B and the exciting frequency f of the electrical field are linked by the relation $$B = \frac{2\pi mf}{e},$$

in which m and e are respectively the electron mass and charge, e.g. for a frequency of 2.45 GHz, the magnetic field is $875.10^{-4}$ T.

The energy transfer is at a maximum when the electrical excitation field is perpendicular to the magnetic field.

2. Prior Art

At present, the introduction of microwave energy into a plasma enclosure takes place in different ways.

Figure 1:
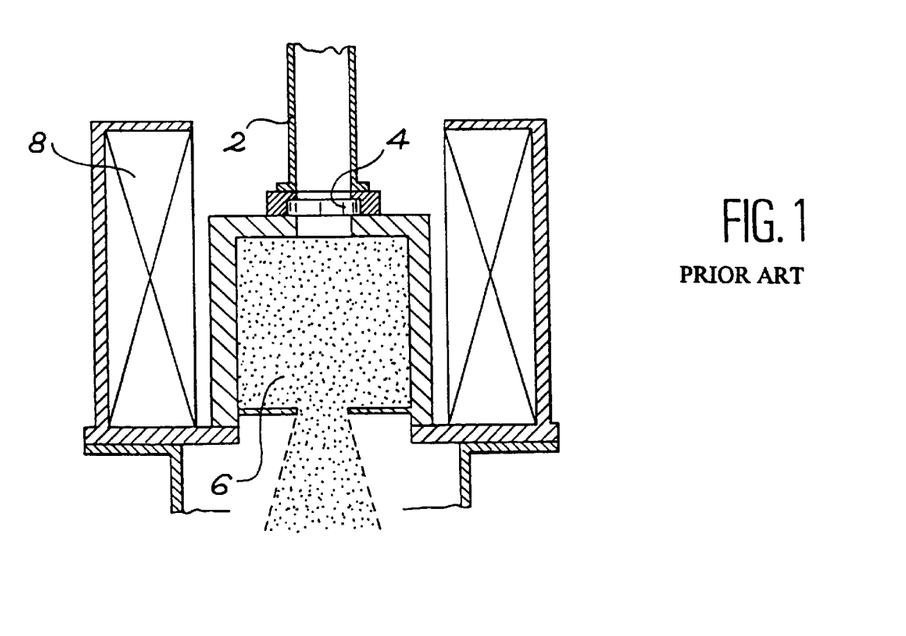
FIGS. 1 and 2, show ready described, prior art, plasma generating devices.

As illustrated in FIG. 1, a first method consists of making the microwave energy arrive in a waveguide 2, said energy then passing through a window 4 and is then transmitted in the use area 6. In said area 6, the microwave exciting field injected in the manner described hereinbefore is combined with a magnetic field generally supplied by coils 8, so that ECR conditions are obtained. In this type of system, the use of a window 4 can be of a constraining nature because, as a function of the envisaged application, said window may be covered by a metallic deposit, which prevents the introduction of microwaves. In addition, said system, with its coils 8, has relatively large dimensions and consequently its use is not very flexible. In practice, it can only be used on an enclosure or chamber designed for receiving it.

Figure 2:
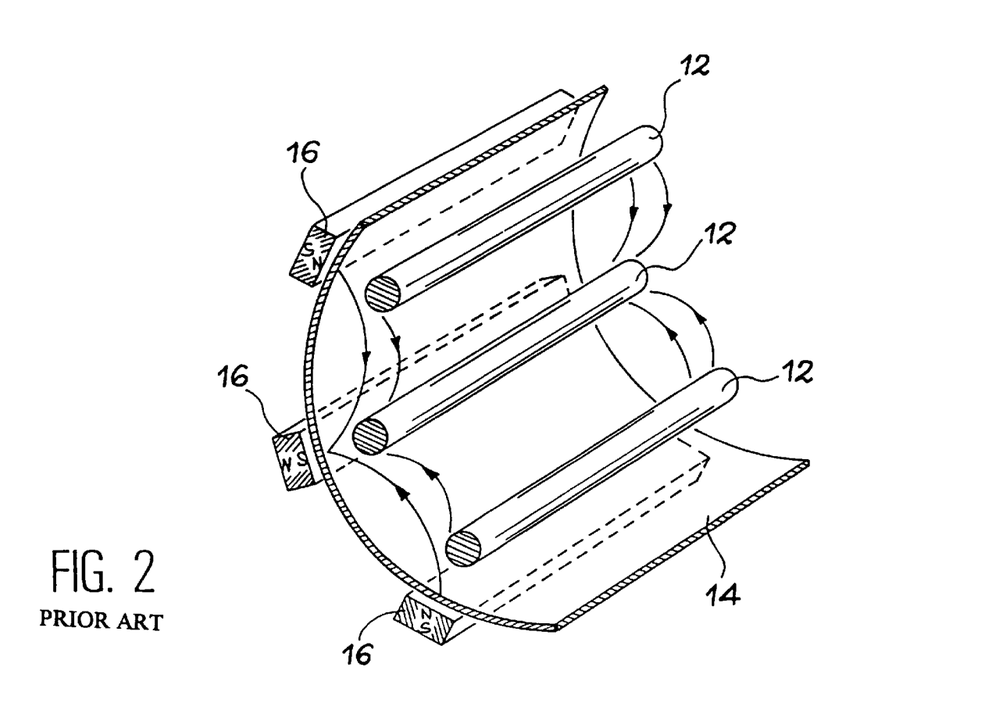

According to another method illustrated in FIG. 2, the microwave energy is introduced by antennas 12 distributed along the walls of an enclosure 14. Magnets 16, which supply the magnetic field necessary for ECR are placed outside the enclosure facing the antennas and their polarity is indicated in FIG. 2. In this system, the antennas 12, in order to be in the area where the magnetic field is approximately $875.10^{-4}$ T, must be close to the walls of the enclosure 14. Moreover, in view of the position of the poles of the magnets, the magnetic field lines are in a plane perpendicular to the axis of the antennas. Thus, a drift current appears in the plasma, the direction of said drift current being perpendicular to the plane containing the magnetic field lines, i.e. parallel to the antenna. This leads to an inhomogeneous plasma along the antenna, which is more dense at one end than the other.

Another device is known from JP-5-314 918. This document describes a cylindrical antenna having four magnets regularly distributed around a circuit for circulating a cooling fluid. However, here again, the field lines are perpendicular to the antenna axis and consequently there is the same diffusion current drift parallel to the antenna.

DESCRIPTION OF THE INVENTION

Therefore an object of the invention is to propose an autonomous exciting device, which can easily be integrated into an enclosure for generating a plasma under electron cyclotron resonance conditions making it possible to solve the problems described hereinbefore.

The invention therefore relates to a microwave antenna having at least one hollow, cylindrical portion containing means for generating a magnetic field in the vicinity of the antenna and characterized in that the magnetic field lines produced are essentially in planes parallel to the generatrices of the cylindrical portion.

With such an antenna structure, the drift current of the plasma is at all times in a plane perpendicular to the generatrices of the cylinder. Therefore said current will describe a trajectory centered on the antenna, which leads to no inhomogeneity in the plasma, unlike what happens in the prior art devices.

According to an embodiment of the invention, the means for generating the magnetic field are constituted by a stack of cylindrical magnets, each end of each magnet facing an end of the same polarity of an immediately adjacent magnet. Alternatively, the magnets can be replaced by coils.

According to another embodiment of the invention, the antenna has two parallel, hollow, cylindrical portions, each containing means for generating a magnetic field in the vicinity of the antenna, the magnetic field lines being essentially in planes passing through the axis of each tubular portion. Thus, in said embodiment, a hairpin-shaped antenna structure is obtained.

The invention more generally relates to a microwave antenna having at least one tubular portion with a central axis, magnets being positioned within the tubular portion along the central axis, said magnets producing a magnetic field in the vicinity of the antenna, each end of each magnet facing an end having the same polarity of an immediately adjacent magnet.

According to a variant, the invention also relates to a microwave antenna having at least one tubular portion with a central axis, electromagnetic coils being arranged within the tubular portion along the central axis, the winding of each coil being such that, when the coil is activated, each of its ends faces an end having the same polarity of an immediately adjacent coil. The wire of said coils can be superconducting.

This type of antenna and in particular the relative arrangement of the magnetic means in the antenna, make it possible to obtain a drift current of the plasma describing a trajectory centered on the antenna, which leads to no inhomogeneity in the plasma, unlike what happens in the prior art.

According to an embodiment, the tubular portion can be a hollow, cylindrical portion, the magnets or coils being stacked in said hollow, cylindrical portion and the lines of the magnetic field produced are then essentially in planes parallel to the generatrices of the cylindrical portion. Such an antenna can also have at least two hollow, cylindrical portions, each containing means for generating a magnetic field in the vicinity of the antenna, the lines of the magnetic field produced in the vicinity of each portion being essentially in planes parallel to the generatrices of said cylindrical portion.

According to another embodiment, the tubular portion can be shaped like a ring, a torus or a loop. The tubular portion can also be positioned in the form of a helix.

In all cases, means can be provided for ensuring the circulation of a coolant.

The invention also relates to a process for producing microtips, which uses an antenna like that described hereinbefore.

Microtip screens are used in the production of displays, for which it is wished to obtain ever larger dimensions, e.g. a diagonal dimension of the screen of 15, 20 or 30 inches or even more. It is therefore necessary to produce very small diameter holes on large surfaces.

At present, the production of microtips in general terms and microtips for flat screens in particular, takes place by vacuum deposition.

Figure 3A:
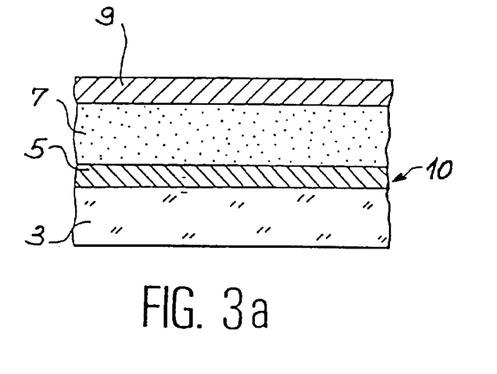
FIGS. 3a to 3f illustrate the different stages of a process for the production of a microtip electron source according to the prior art.
Figure 3B:
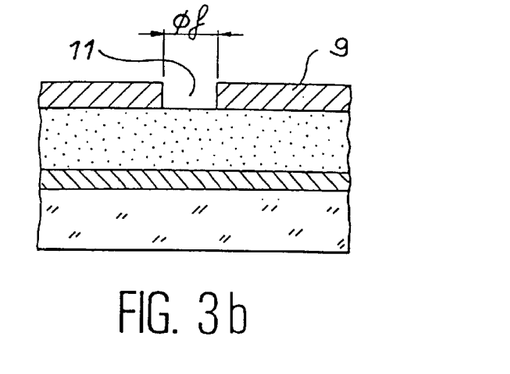
Figure 3C:
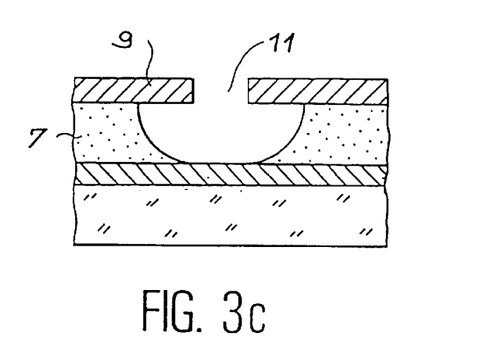
Figure 3D:
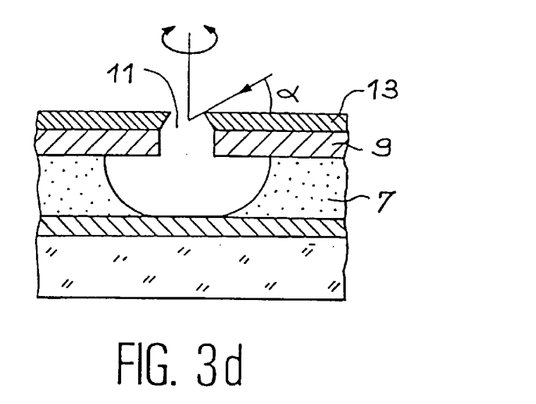
Figure 3E:
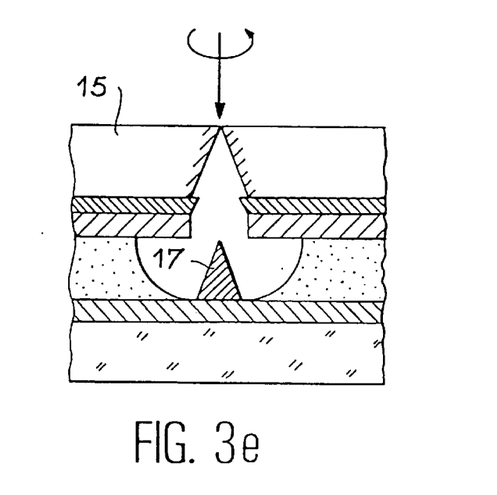
Figure 3F:
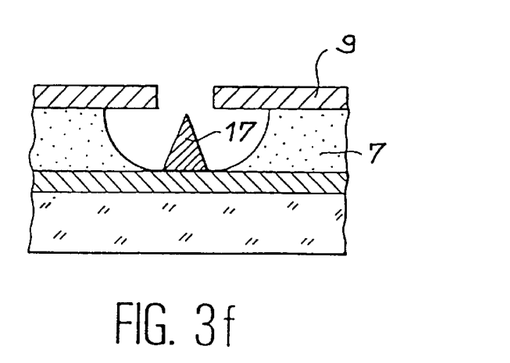

FIGS. 3a to 3f illustrate different stages of a process for producing a microtip electron source by vacuum deposition. Such a process is e.g. described in FR-A-2 593 953 (corresponding U.S. Pat. No. 4,857,161). This process involves the following stages numbered 1 to 9:

1) deposition by cathodic sputtering on a glass substrate 3 of a silicon dioxide layer (not shown in the drawing) of approximately 100 nm;

2) deposition by cathodic sputtering on said layer of a first conductive, indium oxide layer in which will be produced the cathode conductors 5 (approximate thickness 160 nm);

3) etching the first conductive layer to form parallel conductive strips or cathode conductors 5;

4) chemical vapor deposition (from silane, phosphine or oxygen gases) of an insulating layer 7 of silicon dioxide with an approximately thickness of 1 $\mu$m;

5) vapor deposition on the silicon dioxide layer of a conductive layer 9, in which will be formed the grids (niobium, approximate thickness 0.4 $\mu$m);

6) forming holes 11 with a diameter $\phi_f$ in said conductive layer 9 by reactive ionic etching (RIE) using a $SF_6$ plasma (FIG. 3b) and in the layer 7 (FIG. 3c) by reactive ionic etching in a $CHF_3$ plasma or by chemical etching in a solution of hydrofluoric acid and ammonium fluoride;

7) deposition of a nickel layer 13 (FIG. 3d) by vacuum deposition, under grazing incidence with respect to the surface of the structure, the angle $\alpha$ formed between the deposition axis and the surface of the layer being close to 15°, the nickel layer having an approximate thickness of 150 nm;

8) formation of microtips by depositing a molybdenum layer 15 on the complete structure (FIG. 3e), said layer 15 having an approximate thickness of 1.8 $\mu$m and it is deposited under normal incidence with respect to the surface of the structure, said deposition procedure making it possible to obtain molybdenum cones 17 located in holes 11 with a height of 1.2 to 1.5 $\mu$m;

9) selective dissolving of the nickel layer 13 by an electrochemical process so as to free, in the manner shown in FIG. 3f, the perforated niobium grids 9 and bring about the appearance of electron emitting microtips 17.

This procedure suffers from a certain number of disadvantages.

Firstly, the production by vacuum deposition of microtips on very large surfaces cannot at present be carried out and e.g. at present only deposits on screens with diagonal dimensions of 6 inches (15 cm) can be produced. It is also difficult to obtain tips having a controlled and stable composition (e.g. carbides, nitrides, etc.).

The introduction of reactive gases into the enclosure does not make it possible to produce deposits with a controlled composition due to the impossibility of having constant flows of evaporated material at a given deposition time. In addition, in evaporation or deposition, it is very difficult to obtain the composition of the coating equivalent to that of the materials to be evaporated when it is wished to evaporate materials such as MCx, MNx and MOc (M=metal, C=carbon, N=nitrogen and x being the stoichiometric ratio). It is also impossible to produce materials such as diamond-type carbon.

EP-A-564 028 describes a process for producing pointed electrodes using depositions by directed cathodic sputtering using a collimating filter, e.g. formed from a system of parallel tubular elements, which makes it possible to obtain a particle flux with a limited deviation with respect to the direction perpendicular to the substrate.

Figure 4:
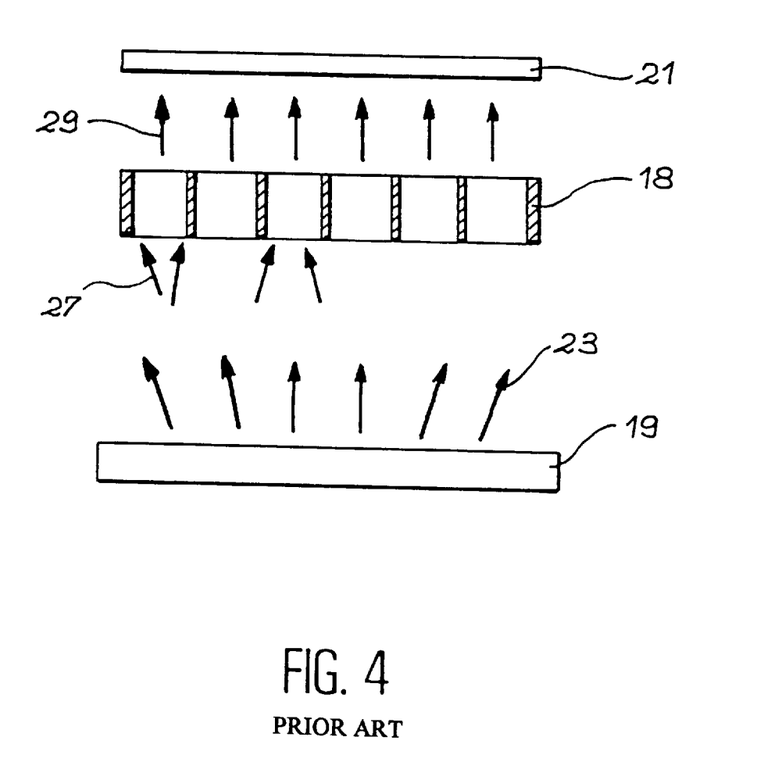
FIG. 4 another illustrates prior art embodiment.

In the aforementioned specification and as illustrated in FIG. 4, a system 18 for channelling the vapor is placed between the cathodic sputtering device 19 and the substrate 21, the vapor flow being illustrated by the arrows 23. The arrows 27 represent the incident vapor on the channelling system and the arrows 29 the channelled vapor. The atoms emitted by the sputtering device not aligned with the channelling system are deposited on the channelling system walls. Thus, this system makes it possible to have a directional flow. However, it leads to a significant reduction in the microtip production efficiency, a large part of the material being deposited on the channelling system walls.

SUMMARY OF THE INVENTION

In order to solve these different problems of the prior art devices and processes, the process according to the invention makes it possible to produce microtips with a controlled composition on large surfaces, with high deposition rates and a good control of the vapor flow (possibility of producing deposits with a homogeneous thickness). This process also makes it possible to produce "reactive" deposits.

More specifically, the invention relates to a process for producing micro-tips with a controlled composition on large surfaces, using a magnetron-type, type, cathodic sputtering method, a microwave discharge produced by one or more microwave antennas like those described hereinbefore generating and maintaining a low pressure plasma, so that electrons can be supplied to the magnetron surface.

In the process according to the invention, in order to obtain high deposition rates, a good vapor flow control and the possibility of making reactive deposits, magnetron cathodic sputtering has been chosen. This method is usable for pressures of approximately $2.10^{-3}$ to $5.10^{-2}$ mbar during the deposition phase. However, as a result of the value of the free average path, these pressures do not make it possible to have directional vapor flows permitting the production of tips in cavities. Moreover, in the considered field, the vacuum deposition or evaporation method was considered to be the only method permitting this production in particular because it has a directional flow, which is not the case in the magnetron method.

The process according to the invention makes it possible to provide an assistance for the magnetron by microwave discharges using an antenna according to the invention. Under these conditions, the vapor flow is more directional and the average free path is approximately 1 meter.

Through using an antenna according to the invention, the plasma drift current describes a trajectory centered on the antenna or on each of the antennas. Therefore the plasma has no inhomogeneities, in accordance with what was stated hereinbefore.

In the process of the invention use can be made of targets with the desired composition, or reactive mode deposits can be made.

Therefore this process permits the deposition of microtips, e.g. for flat screens and replaces the evaporation or deposition procedure.

The process makes it possible to obtain microtips on large surfaces. An "on the move" treatment for these methods is possible.

This process makes it possible to obtain microtips with controlled compositions, which could not be obtained in evaporation or deposition. These compositions can be:

pure metals;

metal-carbon MCx compounds:

supersaturated carbon solutions in the metal, e.g. $MoC_x$, $CrC_x$ and $TiC_x$,
intermediate carbides: $Mo_2C$, $Ti_2C$
higher carbides: MoC TiC . . .
carbides+free carbon MoC+C, $Mo_2CL$;

metal-nitrogen compounds:

$MN_x$ e.g.: $TiN_x$
$MoN_x$
$CrN_x$
nitrides : $Ti_2N$
$Mo_2N$
TiN
MoN

BRIEF DESCRIPTION OF THE DRAWINGS

The features and advantages of the invention can be better gathered from the following description relative to non-limitative, explanatory embodiments with reference to the attached drawings, wherein.

DETAILED DESCRIPTION OF EMBODIMENTS OF THE INVENTION

Figure 5:
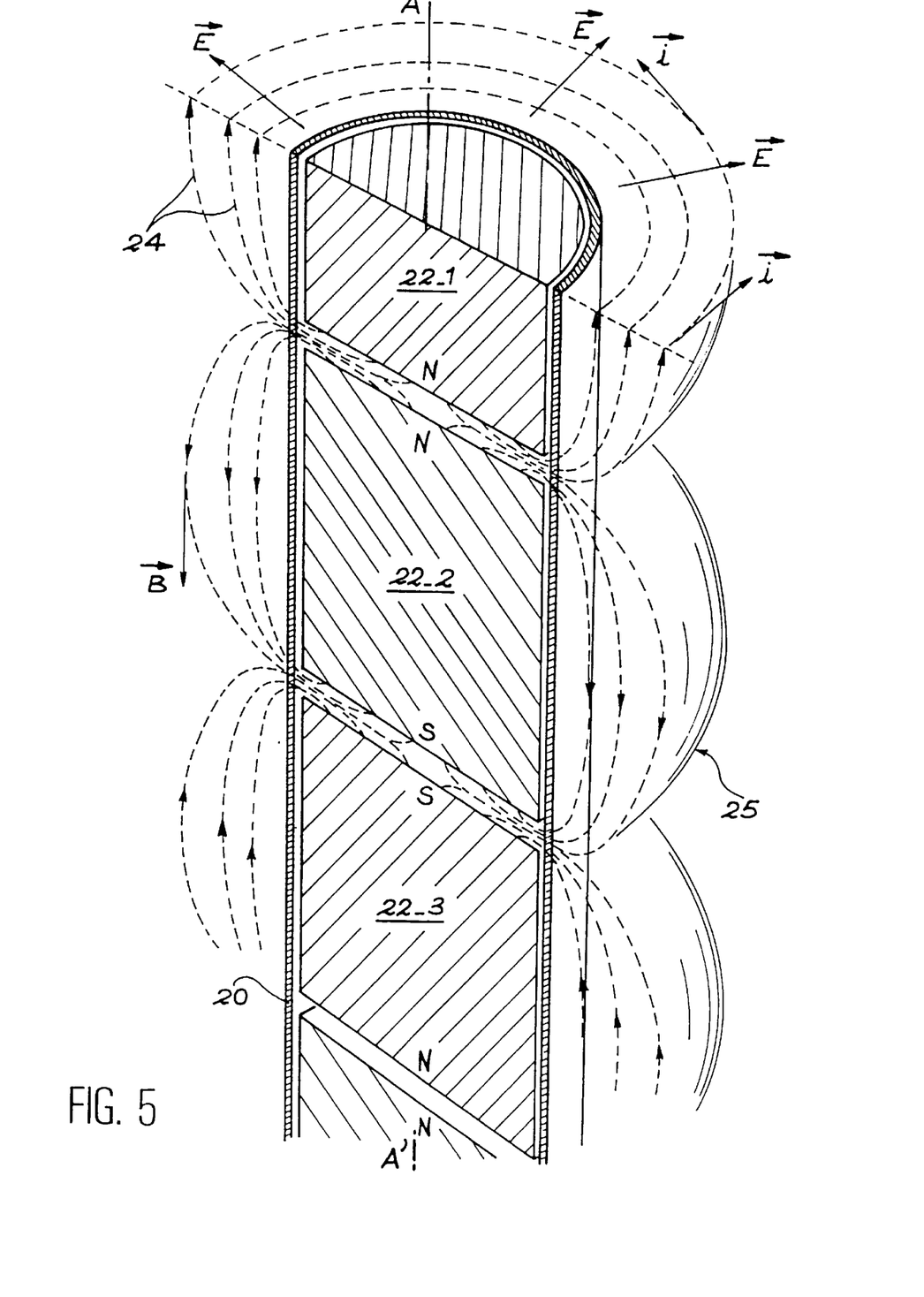
FIG. 5 illustrates the structure of an antenna according to the invention.

FIG. 5 shows an example of an antenna structure according to the invention. The antenna is shaped like a hollow cylinder of revolution 20, with a symmetry axis AA', within which are located cylindrical magnets 22-1, 22-2, 22-3, etc. Each magnet is separated from its neighbors by a distance of e.g. a few millimeters. The separation is e.g. ensured by a small amagnetic material wedge or shim. The poles of these magnets are on planar faces perpendicular to the cylinder axis and the magnets are stacked in such a way that the facing poles of two immediately adjacent magnets (e.g. 22-1 and 22-2) have the same sign. As illustrated in FIG. 5, this structure gives a configuration of magnetic fields in the form of toroidal chevrons surrounding the antenna, the field lines 24 being in or essentially in planes passing through the antenna axis. The fact of placing the magnets in the antenna has the consequence of the latter being located immediately in the area where the intensity of the magnetic field is favorable to electron cyclotron resonance. In addition, as the electrical field is radial, said resonance area is constituted by rings 25 surrounding the antenna. Consequently the volume of the space where resonance takes place is larger than the volume obtained with the prior art devices. Moreover, the magnetic $\vec{B}$ and electrical $\vec{E}$ fields are essentially perpendicular to one another and consequently the energy transfer is at a maximum in this volume.

Moreover, as the magnetic field lines are in planes passing through the antenna axis, the drift current $\vec{i}$ of the plasma is at all times perpendicular to such a plane, as illustrated in FIG. 5. Therefore said current will describe a circle centered on the antenna, which gives rise to no inhomogeneity in the plasma.

The antenna of FIG. 5 is in the form of a cylinder of revolution and has an axis of symmetry AA'. However, it is clear that the invention can be applied to an antenna not having such a symmetry. In a cylinder with a random section, a stack of magnets respecting the order of the polarities indicated hereinbefore can be introduced, the magnets having a shape adapted to the section of the cylinder. The magnetic field lines are then contained in planes parallel to the generatrices of the cylinder. In this case, as in the preceding case, the antenna is in the area where the intensity of the magnetic field is favorable for electron cyclotron resonance, the resonance area being constituted by rings surrounding the antenna and the fields $\vec{B}$ and $\vec{E}$ are still essentially perpendicular to one another.

Figure 6:
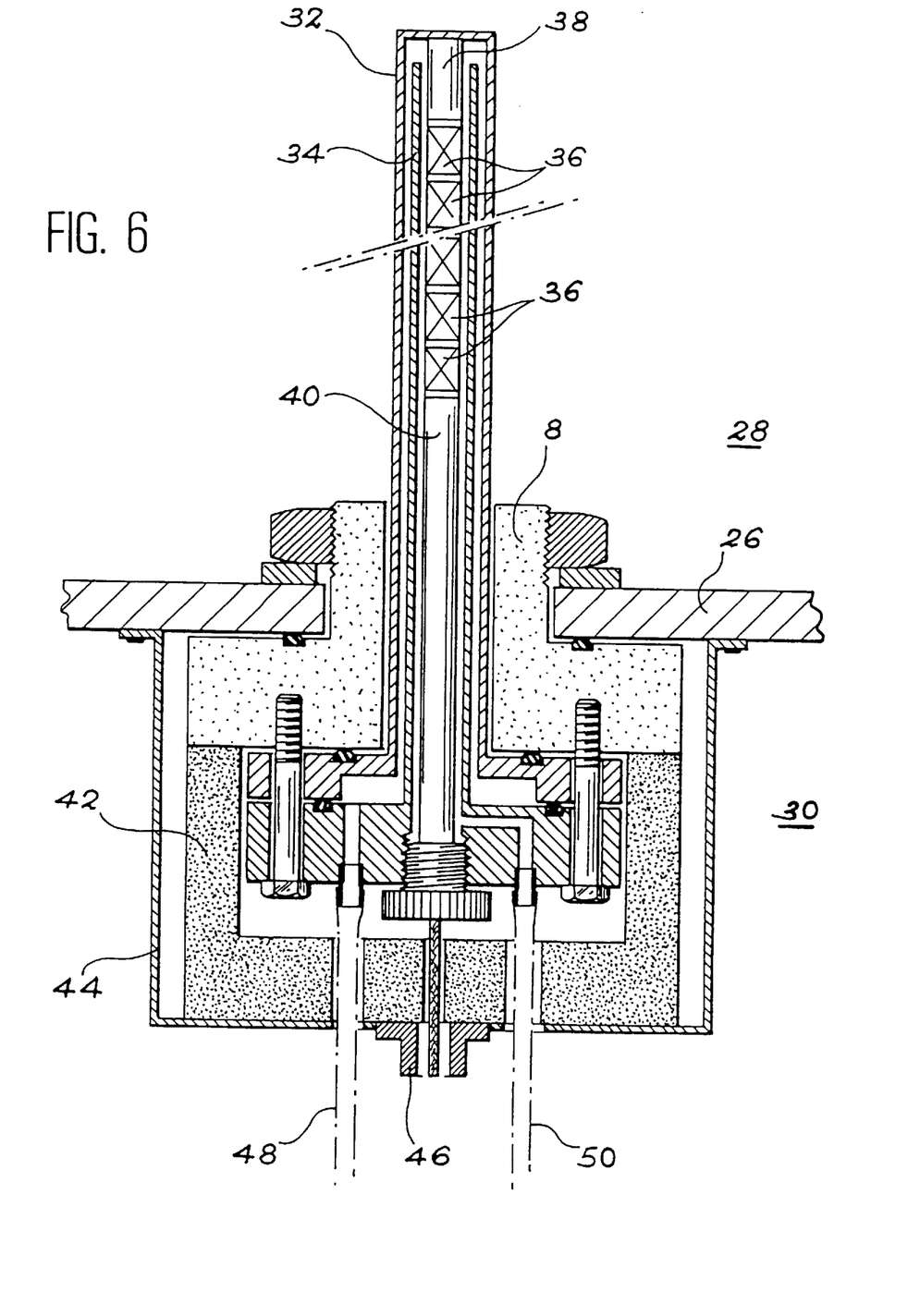
FIG. 6 illustrates an antenna according to the invention with its connection system to a microwave power supply.

The antenna also has a system for connecting to a microwave power supply. This connecting system can be a coaxial passage, as illustrated in FIG. 6, which represents the complete antenna. In more detailed manner, reference 26 designates a wall of an enclosure separating the working area 28 (where the electrical and magnetic fields are induced) from the outer area 30. The antenna comprises an external tube 32 and an internal tube 34, in which the magnets 36 are stacked in the manner described hereinbefore, two shims 38 and 40 on either side defining their extension area. An insulating part 42 ensures the necessary seal between the interior 28 and the exterior 30 of the enclosure. References 42 and 44 respectively designate an insulating cap and a conductive cap connected to earth or ground. The coaxial connector 46 ensures the connection to a microwave power supply. References 48 and 50 designate insulating entrance and exit tubes for a cooling circuit permitting the circulation of a coolant, e.g. water.

Figure 7A:
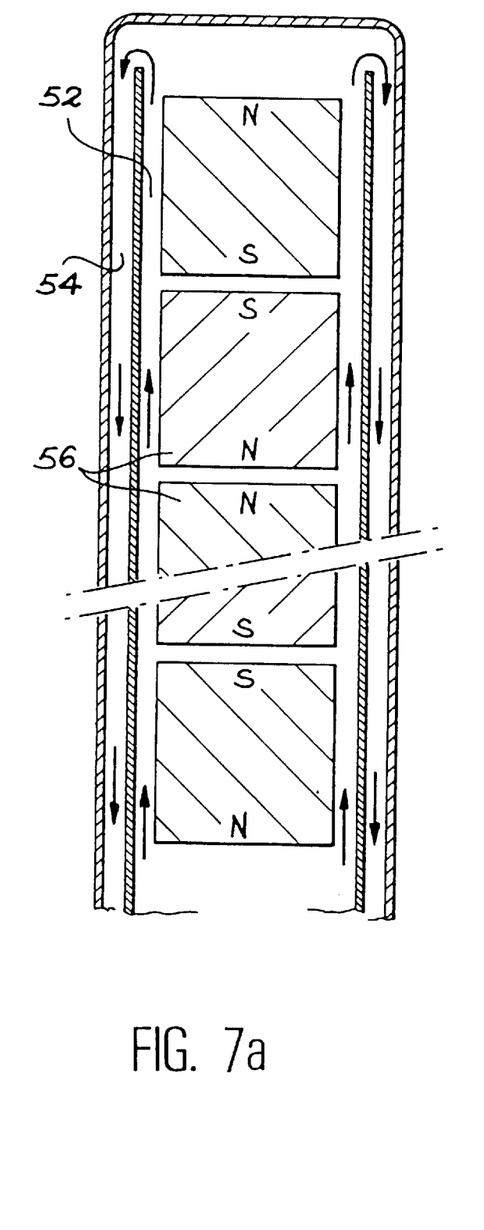
FIGS. 7a and 7b illustrate two rectilinear antennas according to the invention with two different circuits for the circulation of a coolant.
Figure 7B:
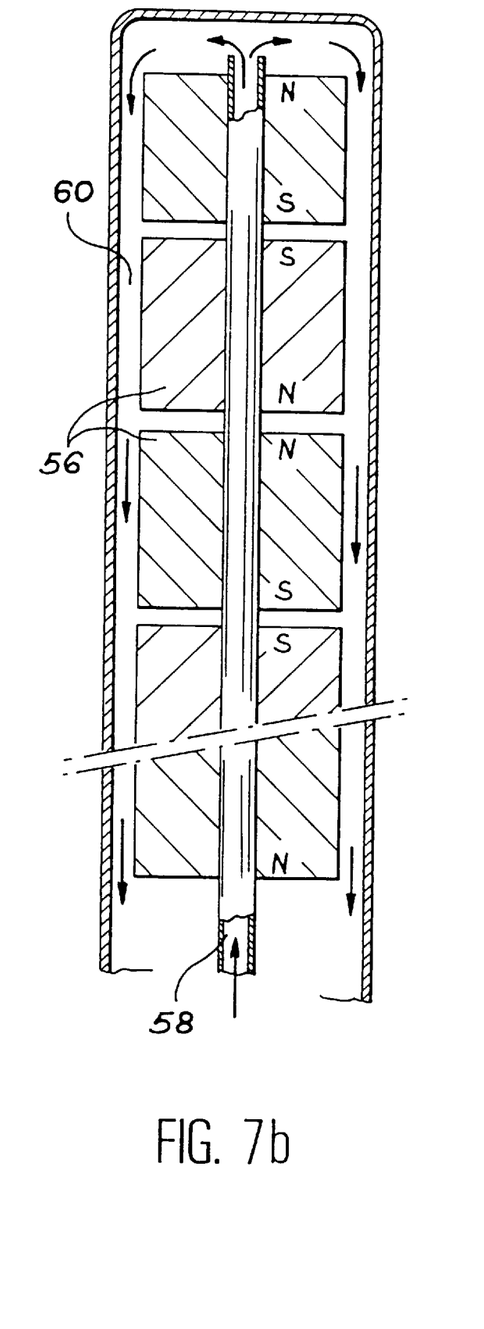

FIGS. 7a and 7b show two possible variants of the cooling circuit. In FIG. 7a the cooling circuit is constituted by a double peripheral envelope 52, 54. The fluid flows in a path parallel to the axis of the cylinder (or more generally at the generatrices of the cylinder), along the magnets 56 and then returns in the reverse direction still parallel to the cylinder axis or the cylinder generatrices. In the variant of FIG. 7b, the magnets 56 have been perforated along the cylinder axis, or more generally parallel to the cylinder generatrices, which makes it possible to introduce a cylindrical tube 58, which permits the introduction of the coolant. On reaching the upper end of the stack of magnets, the fluid returns in a path still parallel to the axis of the cylinder or to the generatrices of the cylinder, but passing along the peripheral portion 60 of the magnets.

Figure 5A:
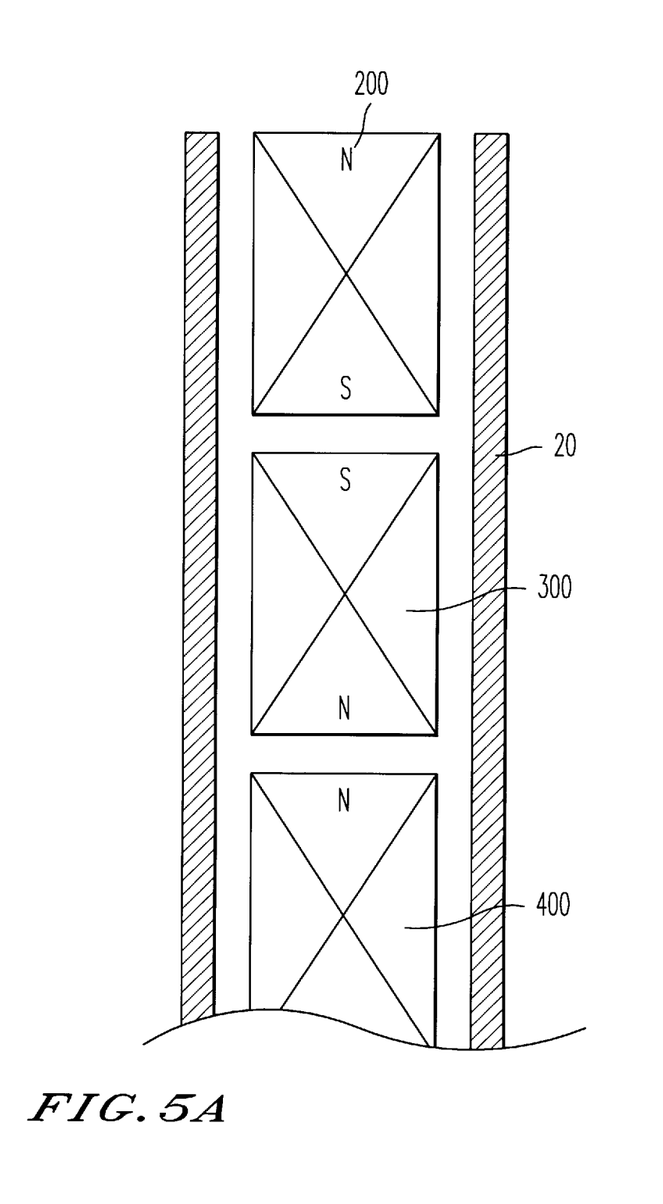

In a variant, as illustrated in FIG. 5A, the magnets can be replaced by coils, 200, 300 and 400 the material forming the wire of the coils possibly being superconductive. The winding of each coil is such that, when the coil is activated, each of its ends faces an end having the same polarity of an immediately adjacent coil.

Figure 8:
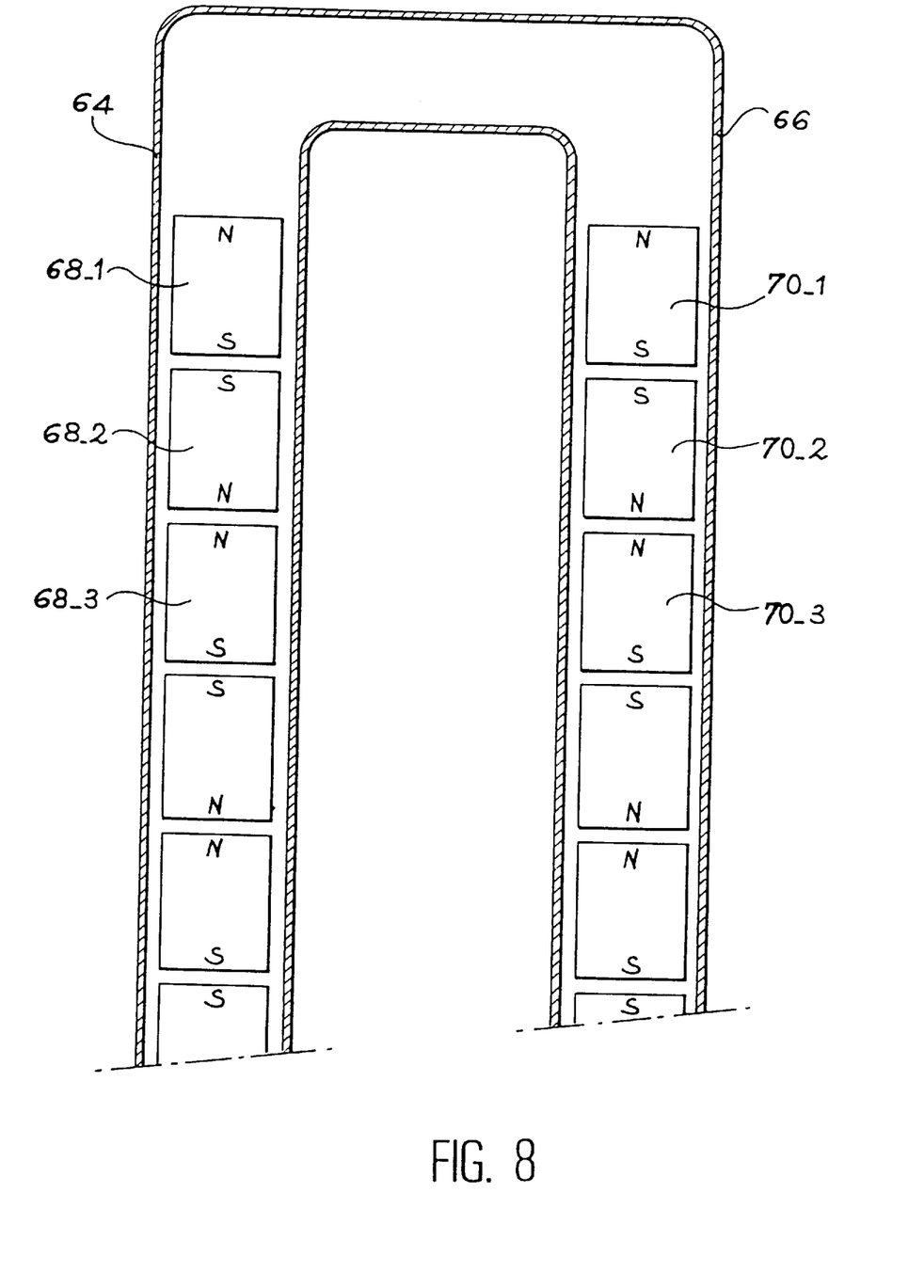
FIG. 8 illustrates an antenna structure according to the invention shaped like a hairpin.

According to another embodiment of the invention, the antenna has two branches 64, 66 connected by one of their ends and is e.g. in the form of a hairpin, as illustrated in FIG. 8. In each of the branches there is a stack of cylindrical magnets 68-1, 68-2, ..., 70-1, 70-2, ..., the polarity of the magnets in each branch of the hairpin oriented in the manner described hereinbefore. Preferably, these magnets (e.g. 68-1, 70-1) facing one another in each of the branches of the hairpin have polarities oriented in the same direction. One end of a branch is connected to the generator and the other end of the branch to earth.

More generally, branches having more complex shapes can be produced (staircase, V, etc.), the antenna then having at least two hollowed, cylindrical portions, each containing means for generating a magnetic field in the vicinity of the antenna, the lines of the magnetic field produced in the vicinity of each portion being in or essentially in planes parallel to the generatrices of said cylindrical portion.

In an example, an antenna was produced, constituted by a copper tube with a diameter of 25 mm, in which were stacked ten cylindrical magnets arranged in opposition, as described hereinbefore. These samarium-cobalt magnets had a length of 20 mm and a diameter of 20 mm. The length occupied by the magnets, in this case 240 mm, constitutes the active area of the antenna. This length can be modified by changing the number of magnets and is not critical. The microwave power is supplied to the antenna by a coaxial passage of impedance 50 Ohms. With such a device, the plasma can be generated in an argon atmosphere at pressures of a few $10^{-5}$ mbar.

The invention more generally relates to an antenna having at least one tubular portion, the tube e.g. being shaped like a ring, a torus, or a loop. It can also be arranged in the form of a helix. The tube is positioned along an axis or defines an axis. Within said tube, electromagnetic coils or magnets are arranged along said axis.

Figure 9:
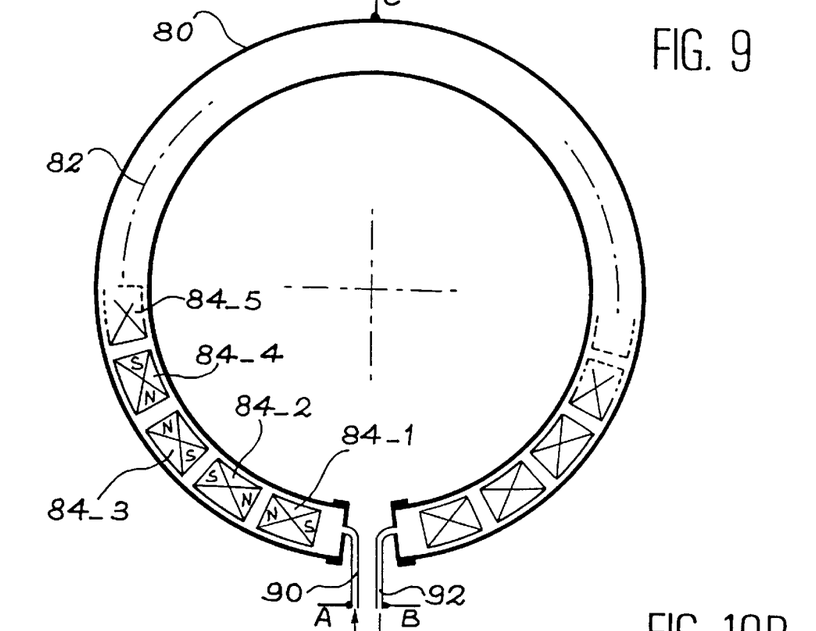
FIGS. 9, 10A and 10B illustrate other variants of the invention.

An embodiment is given in FIG. 9, where reference 80 designates a tube defining the shape of a ring or a loop. This tube e.g. has a constant circular section and in this case it is essentially toroidal. It is possible to define an axis 82 within the tube. Along said axis 82 are positioned means 84-1, 84-2, 84-3, etc., which make it possible to produce a magnetic field in the vicinity of the tube 80. These means can be permanent magnets or electromagnetic coils. Magnets are shown in FIG. 9. Each magnet is separated from each of its neighbors by a distance of e.g. a few millimeters. This separation is e.g. ensured by a small, amagnetic material shim or wedge. The poles of these magnets are on faces substantially perpendicular to the cylinder axis and the magnets are arranged in such a way that the facing poles of two immediately adjacent magnets (e.g. 84-2 and 84-3) have the same sign.

Figure 10A:
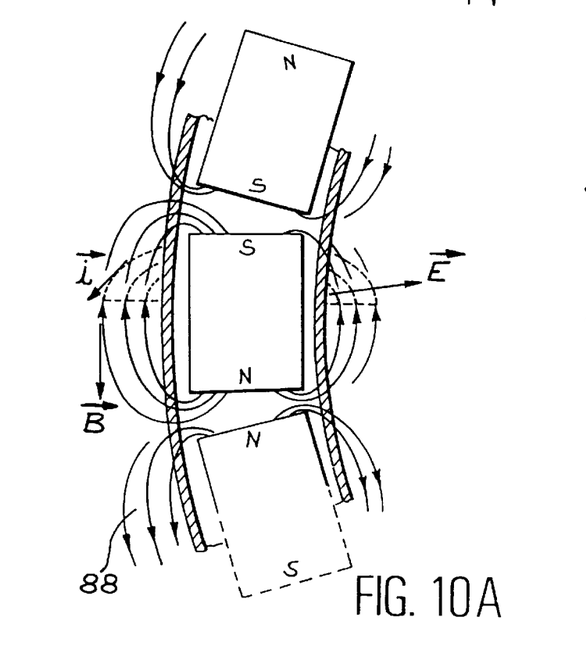
Figure 10B:
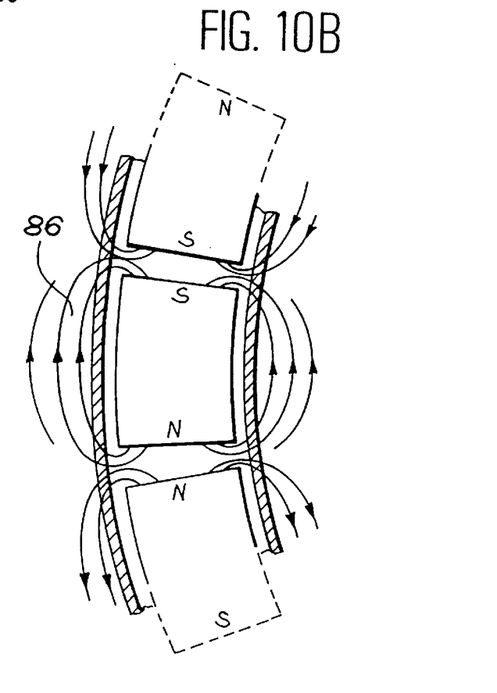
Figure 11A:
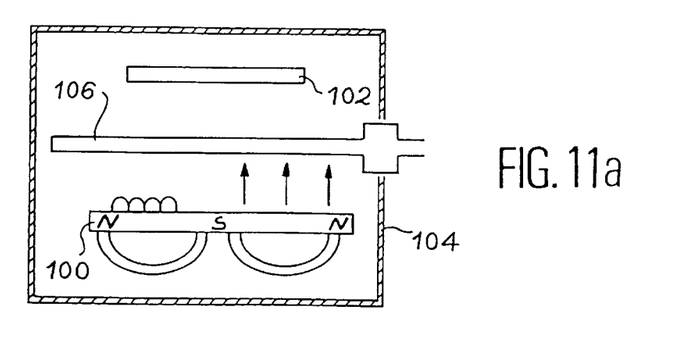
FIGS. 11a–11b and 12a–12b illustrate two embodiments of the process for the production of microtips according to the invention, respectively in a side view (FIGS. 11a and 12a) and in a plan view (FIGS. 11b and 12b).
Figure 11B:
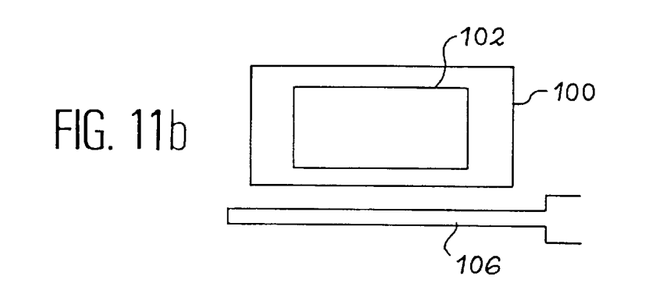
Figure 12A:
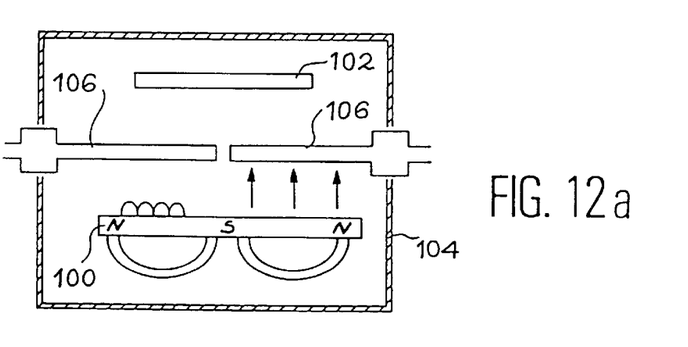
Figure 12B:
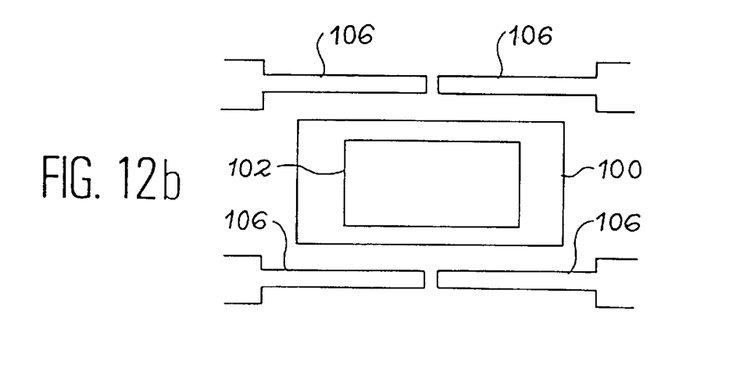

The arrangement of three consecutive magnets is shown in greater detail in FIGS. 10A and 10B. In FIG. 10A, the magnets are cylindrical magnets. The expert would be able to choose a size such that there is sufficient clearance to permit their introduction into the corresponding tube. The magnets can be placed in a flexible sheath, which can then be introduced into the tubular antenna.

In FIG. 10B the magnets are truncated cone-shaped and have the same curvature as the tubular portion of the antenna into which they are introduced.

In all cases a magnetic field configuration is obtained which has, as in the case illustrated in FIG. 5, an approximately chevron structure surrounding the antenna. As the magnets are placed in the antenna the latter is immediately located in the area where the magnetic field intensity is favorable to ECR. Here again the field $\vec{E}$ is radial and the resonance area is constituted by rings 86, 88 surrounding the antenna. Consequently the volume of the space where resonance takes place exceeds the volume obtained with the prior art devices. The magnetic B and electrical E fields are essentially perpendicular to one another and the energy transfer is at a maximum in said volume.

Due to the curvature of the antenna, it is no longer possible, strictly speaking, to say that the magnetic field lines are in planes passing through the tube axis. However, this still approximately applies. Therefore the drift current $\vec{i}$ of the plasma is at all times contained in a plane perpendicular to the axis of the tube 80 (or equivalently in a plane defining the section of said tube). Therefore said current will approximately describe a circle centered on the antenna, which leads to no inhomogeneity of the plasma.

The antenna shown in FIG. 9 has the overall shape of a ring or torus. It is clear that the teaching of the invention is not limited to said shape of a tubular portion. The latter can also e.g. have an axis arranged along a helix, with the same stacks of electromagnetic coils or magnets. The antenna can also be shaped like an inwardly curved tube, e.g. obtained by curving from the straight cylindrical shape of FIG. 5. All these antennas function with the same properties and advantages as the straight antenna described hereinbefore in conjunction with FIG. 5 and only the curvature varies.

In FIG. 9, the ducts 90, 92 represent cooling liquid or fluid or coolant entry and exit ducts. Within the tube 80, said liquid will circulate along the magnets or magnetic coils. It is also possible or is alternatively possible for it to circulate within a tube, not shown in FIG. 9, which traverses all the magnets, in equivalent manner to the tube 58 of FIG. 7B.

In a circuit like that illustrated in FIG. 9, the introduction of the microwave energy can e.g. take place between the points A and B, one of these points being connected to earth. Alternatively, the points A and B can be connected to earth and energy introduced between points C and A. A not shown coaxial connector can e.g. make it possible to ensure the connection to a microwave power supply.

The field of application of the antenna according to the invention is plasma production. It could therefore be used in all systems utilizing plasmas (deposition by cathodic sputtering, ionic assistance during deposition, PECVD, ionic etching, ion source, radical source, etc.).

An exemplified application to the production of microtips will now be described in conjunction with FIGS. 11a, 12a and 11b, 12b. In these drawings are shown a magnetron vapor source 100, a substrate 102, a vacuum enclosure 104 and one or more antennas 106. Microtip deposition is to take place on the substrate.

Industrially, magnetrons exist with a length of several meters (e.g. for on the move deposits on glazings). It is thus possible to envisage deposits "on the move" on large screens, or several small, juxtaposed screens.

Use is made of a magnetron assistance system by a microwave discharge in order to directly generate the plasma at low pressure ($10^{-5}$ mb) without gas addition. The electrons of the plasma are trapped around the microwave antenna or antennas with the aid of a magnetic field and their efficiency is increased by the electron cyclotron resonance effect. This resonance effect is e.g. obtained with a magnetic field of $875.10^{-4}$ T combined with an electric field of frequency 2.45 GHz.

An implementation of the invention is e.g. obtained by considering the different stages (1) to (9) given in the introduction to the present application and replacing therein the stages using vacuum deposition by plasma assisted magnetron evaporation, the latter being produced with the aid of an antenna according to the invention.

Consequently, with the aid of one or more antennas according to the invention, it is possible to produce a microwave discharge under electron cyclotron resonance conditions, said discharge generating and maintaining a low pressure plasma. The latter is used as an assistance system for a magnetron, on the surface of which it permits the dispatch of electrons. It is thus possible to use the magnetron at a lower pressure and therefore make the vapor flow directional.

Variants of the invention make it possible to retain the advantages of magnetron cathodic sputtering, namely the possibility of treating large substrates and an infinite choice with respect to the materials.

For producing these deposits, it is possible to use targets with the desired composition, e.g. a $Cr_3C_2$ target, or produce reactive mode deposits, i.e. starting with a pure Cr target and injecting into the cold plasma hydrocarbon (e.g. $C_2H_2$—$CH_4$) during the deposition phase.

This procedure which is similar to PVD and CVD makes it possible to obtain compounds which could not be obtained in a conventional manner. It is thus possible to produce supersaturated carbon coatings not obtainable by conventional thermodynamics.

This procedure makes it possible to regulate and adjust the stoichiometry of the compounds, e.g. MoCx, CrCx, TiCx, TaCx, etc. either by forming supersaturated solutions, or intermediate carbides, e.g. $Mo_2C$, or carbides more charged with carbon, e.g. MoC. It is also possible to produce coatings containing more carbon than the compounds described in the literature. The production of nitrides, e.g. MoNx, TiNx, CrNx, TaNx or carbonitrides is possible by introducing reactive gas mixtures into the plasma (e.g. CxHy and $N_2$). It is also possible to introduce oxidizing gases (e.g. $O_2$), so that oxycarbides or nitrides can be produced.

As a function of the production conditions, such as the substrate temperature, reactive gas pressure, polarization of the substrates, etc., the compounds can be amorphous, monocrystalline or very well crystallized.

This method in particular makes it possible to produce diamond-type carbon using graphite targets and incorporating into the plasma compounds of the CxRy and $H_2$ types. These coatings can also be doped by boron or phosphorus using e.g. reactive gases in the plasma (e.g. diborane, phosphine, $PH_3$).

We claim:

1. A microwave antenna for plasma generation having at least one tubular portion with a central axis, wherein magnets are placed within the tubular portion along the central axis in order to generate a magnetic field B in a vicinity of the antenna, each end of each magnet facing an end having the same polarity of an immediately adjacent magnet, said antenna having a system for connecting to a microwave power supply of frequency f, f and B being linked by a relation $B=2\pi mf/e$, where m is electron mass and e is energy, wherein magnetic field lines of the magnetic field generated by said magnets are disposed in planes which pass through said central axis, a drift current of the plasma describing a trajectory centered on the antenna.

2. A microwave antenna for plasma generation having at least one tubular portion with a central axis, wherein electromagnetic coils are positioned within the tubular portion along the central axis, in order to generate a magnetic field B in a vicinity of the antenna, a winding of each coil being such that, when the coil is activated, each of its ends faces an end having the same polarity of an immediately adjacent coil, said antenna having a system for connecting to a microwave power supply of frequency f, f and B being linked by a relation $B=2\pi mf/e$ where m is electron mass and e is energy, wherein magnetic field lines of the magnetic field generated by said electromagnetic coils are disposed in planes which pass through the central axis, a drift current of the plasma describing a trajectory centered on the antenna.

3. A microwave antenna according to claim 2, wherein wires of the coils are superconductive.

4. A microwave antenna having at least one tubular portion with a central axis, wherein magnets are placed within the tubular portion along the central axis in order to generate a magnetic field B in a vicinity of the antenna, each end of each magnet facing an end having the same polarity of an immediately adjacent magnet, said antenna having a system for connecting to a microwave power supply of frequency f, f and B being linked by a relation $B=2\pi mf/e$, where m is electron mass and e is energy wherein the tubular portion is a hollow cylindrical portion, the magnets are stacked in said cylindrical portion, and lines of the magnet field produced are essentially in planes parallel to generatrices of the cylindrical portion, a drift current of the plasma describing a trajectory centered on the antenna.

5. A microwave antenna according to claim 4, including at least two hollow, cylindrical portions, each portion containing means for generating a magnetic field in the vicinity of the antenna, the lines of the magnetic field produced in the vicinity of each portion being essentially in planes parallel to the generatrices of said cylindrical portion.

6. A microwave antenna according to any one of claims 1 to 3, wherein the tubular portion is shaped like a ring or torus.

7. A microwave antenna according to any one of claims 1 to 3, wherein the tubular portion is shaped like a helix.

8. A microwave antenna according to any one of claims 1 to 3, further comprising means for circulating a coolant.

9. A process for the production of microtips, having a controlled composition and on large surfaces, using magnetron cathodic sputtering, a microwave discharge, and produced by one or more microwave antennas, which comprises generating and maintaining a low pressure plasma so that electrons can be supplied to the magnetron surface, wherein the microwave antenna has at least one tubular portion with a central axis, and magnets are placed within the tubular portion along the central axis in order to generate a magnetic field B in a vicinity of the antenna, each end of each magnet facing an end having the same polarity of an immediately adjacent magnet, said antenna having a system for connecting to a microwave power supply of frequency f, f and B being linked by a relation $B=2\pi mf/e$ where m is electron mass and e is energy, and a drift current of the plasma describing a trajectory centered on the antenna.

10. A process according to claim 9, wherein targets of the desired composition are used on which depositions take place in a reactive mode.

11. A process according to claim 9, wherein the microtips are produced on large surfaces.

12. A microwave antenna having at least one tubular portion with a central axis, wherein electromagnetic coils are placed within the tubular portion along the central axis in order to generate a magnetic field B in a vicinity of the antenna, a winding of each coil being such that, when the coil is activated, each of its ends faces an end having the same polarity of an immediately adjacent coil, said antenna having a system for connecting to a microwave power supply of frequency f, f and B being linked by a relation $B=2\pi mf/e$, where m is electron mass and e is energy, wherein the tubular portion is a hollow cylindrical portion, the coils are stacked in said cylindrical portion, and lines of the magnetic field produced are essentially in planes parallel to generatrices of the cylindrical portion, a drift current of the plasma describing a trajectory centered on the antenna.

13. A process for the production of microtips, having a controlled composition and on large surfaces, using magnetron cathodic sputtering, a microwave discharge, and produced by one or more microwave antennas, which comprises generating and maintaining a low pressure plasma so that electrons can be supplied to the magnetron surface, wherein the microwave antenna has at least one tubular portion with a central axis, and electromagnetic coils are placed within the tubular portion along the central axis in order to generate a magnetic field B in a vicinity of the antenna, a winding of each coil being such that, when the coil is activated, each of its ends faces an end having the same polarity of an immediately adjacent coil, said antenna having a system for connecting to a microwave power supply of frequency f, f and B being linked by a relation $B=2\pi mf/e$, where m is electron mass and e is energy and a drift current of the plasma describing a trajectory centered on the antenna.

* * * * *